(12) United States Patent
McMillen et al.

(10) Patent No.: US 8,359,975 B2
(45) Date of Patent: Jan. 29, 2013

(54) PROCESS AND APPARATUS HAVING AN ADJUSTABLE HEATER

(75) Inventors: Robert A. McMillen, Downingtown, PA (US); Dietmar Dudek, Langen (DE); Ib Vestergaard, Tommerup (DK)

(73) Assignee: E.I. du Pont de Nemours and Company, Wilmington, DE (US)

( * ) Notice: Subject to any disclaimer, the term of this patent is extended or adjusted under 35 U.S.C. 154(b) by 760 days.

(21) Appl. No.: 12/428,592

(22) Filed: Apr. 23, 2009

(65) Prior Publication Data

US 2009/0288569 A1    Nov. 26, 2009

Related U.S. Application Data

(60) Provisional application No. 61/128,645, filed on May 23, 2008.

(51) Int. Cl.
*B41C 1/055* (2006.01)
*G03F 7/26* (2006.01)
(52) U.S. Cl. .................... 101/401.1; 430/306; 219/216; 219/388
(58) Field of Classification Search ............... 101/401.1
See application file for complete search history.

(56) References Cited

U.S. PATENT DOCUMENTS

| | | | | |
|---|---|---|---|---|
| 2,479,913 | A * | 8/1949 | Doyle | 219/388 |
| 2,680,304 | A * | 6/1954 | Herbert, Jr. | 219/388 |
| 3,164,717 | A * | 1/1965 | Kaufman | 219/388 |
| 3,829,982 | A * | 8/1974 | Pray et al. | 392/417 |
| 4,929,814 | A * | 5/1990 | Lisec | 219/388 |
| 5,279,697 | A | 1/1994 | Peterson et al. | |
| 6,297,478 | B1 * | 10/2001 | Kano et al. | 219/388 |
| 6,797,454 | B1 | 9/2004 | Johnson et al. | |
| 6,998,218 | B2 | 2/2006 | Markhart | |
| 7,041,432 | B2 | 5/2006 | Markhart | |
| 7,044,055 | B2 | 5/2006 | Gotsick et al. | |
| 7,152,529 | B2 | 12/2006 | Gotsick et al. | |
| 7,156,630 | B2 | 1/2007 | Roberts et al. | |
| 7,202,008 | B2 | 4/2007 | Roshelli, Jr. et al. | |
| 7,237,482 | B2 | 7/2007 | Vest et al. | |
| 7,241,124 | B2 | 7/2007 | Roberts et al. | |
| 7,358,026 | B2 | 4/2008 | Dudek et al. | |
| 7,398,812 | B2 | 7/2008 | Hackler et al. | |
| 7,422,840 | B2 | 9/2008 | Dudek et al. | |
| 7,491,003 | B2 | 2/2009 | Hackler et al. | |
| 7,503,258 | B2 | 3/2009 | McMillen et al. | |
| 2005/0084791 | A1 | 4/2005 | Hackler et al. | |
| 2006/0124009 | A1 | 6/2006 | Markhart | |
| 2007/0051262 | A1 | 3/2007 | Gotsick et al. | |
| 2007/0084368 | A1 | 4/2007 | Vest et al. | |

FOREIGN PATENT DOCUMENTS

WO    WO 2007/012023 A2    1/2007

* cited by examiner

*Primary Examiner* — Jill Culler

(57) ABSTRACT

This invention provides an apparatus and process for forming a printing form from a photosensitive element having an exterior surface and a composition layer capable of being partially liquefied. The apparatus includes a displaceable heater for heating the composition layer, means for removing at least a portion of the composition layer from the element, and means for displacing the displaceable heater to a predetermined distance from the exterior surface. Positioning the displaceable heater at the predetermined distance assures reproducible removal of the liquefied composition from the various types of photosensitive elements that can be thermally treated in the apparatus, resulting in the printing forms having improved relief surface uniformity.

20 Claims, 2 Drawing Sheets

PROCESS AND APPARATUS HAVING AN ADJUSTABLE HEATER

BACKGROUND OF THE INVENTION

1. Field of the Invention

This invention pertains to an apparatus and process for forming a printing form from a photosensitive element and, in particular, to an apparatus and a process for forming the printing form by a thermal development process and, more particularly, to an apparatus and a process for thermally developing a photosensitive element having a cylindrical support.

2. Description of Related Art

Flexographic printing plates are well known for use in relief printing on a variety of substrates such as paper, corrugated board, films, foils and laminates. Flexographic printing plates can be prepared from photosensitive elements containing a layer of a photosensitive composition such as those described in U.S. Pat. Nos. 4,323,637 and 4,427,759. Photosensitive compositions, which may be referred to as photopolymerizable compositions, generally contain an elastomeric binder, at least one monomer, and a photoinitiator. Photosensitive elements generally have the layer of the photopolymerizable composition interposed between a support and a cover sheet or multilayer cover element. Upon imagewise exposure of the photosensitive element to actinic radiation, photopolymerization of the photosensitive composition occurs in the exposed areas, thereby curing and rendering insoluble the exposed areas of the layer. Conventionally, the element is treated with a suitable solution, e.g., solvent or solvent mixture or aqueous-based solution, to remove areas of the photopolymerizable layer that were not exposed and leaving a printing relief which can be used for flexographic printing.

However, developing systems that treat the element with a solution are time consuming since drying for extended period (0.5 to 24 hours) is necessary to remove developer solution entrained in the element. In addition, developing systems that use solvent solutions also can produce volatile organic vapor as well as potentially harmful by-products as waste (both the solvent and any material carried off by the solvent) during development.

As an alternative to solution development, a "dry" thermal development process may be used which removes the unexposed areas without the subsequent time-consuming drying step. In a thermal development process, the composition layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. Nos. 3,060,023 (Burg et al.); 3,264,103 (Cohen et al.); 5,015,556 (Martens); 5,175,072 (Martens); 5,215,859 (Martens) and 5,279, 697 (Peterson et al.). The exposed portions of the composition layer remain hard, that is, do not soften or melt, at the softening temperature for the unexposed portions. The absorbent material collects the softened un-irradiated material and then is separated and/or removed from the composition layer. The cycle of heating and contacting the composition layer may need to be repeated several times in order to sufficiently remove the flowable composition from the unirradiated areas and form a relief structure suitable for printing. Thus remains a raised relief structure of irradiated, hardened composition that represents the desired printing image.

Processors for thermal development of flexographic printing elements are known. U.S. Pat. No. 5,279,697 (Peterson et al.) describes an automated process and apparatus for heat treating an imagewise irradiated photosensitive sheet to remove unwanted portions and leave radiation hardened relief images on the sheet. PCT publication WO 2001/18604 also describes a method and apparatus for thermal processing a photosensitive element. In both thermal processing apparatuses an irradiated photosensitive printing element comprising the support and the composition layer is mounted on a drum and a continuous web of absorbent material is passed over a hot roll. The hot roll is urged towards the drum pressing the web against the photosensitive element and forming a nip. Heat is transferred by conduction from the hot roll, through the absorbent web, to the photosensitive element upon contact so the temperature of the composition layer is raised sufficiently to enable the unirradiated portions of the composition layer to liquefy and be absorbed into the absorbent material. As the drum and hot roll rotate in contact together, the web is pressed against the photosensitive element to absorb the liquefied unirradiated composition and is then separated from the element. Several cycles of passing the element past the hot roll are repeated to progressively remove the unirradiated composition from the printing element. After the unirradiated composition is removed the resulting element has a raised relief surface of hardened areas that is suitable use as a printing plate. PCT publication WO 2001/18604 also discloses that an infrared heater can be used to heat or aid in heating of the photosensitive element.

Up to now, flat or planar photosensitive printing elements were typically processed in commercial thermal development processors. It was also possible to thermally process cylindrically-shaped photosensitive printing elements, such as seamless photopolymer sleeves, or so called plate-on-sleeves. Seamless photopolymer sleeves include at least a continuous or substantially continuous layer of the photopolymerizable composition on a cylindrical support. Plate-on-sleeves include a flat photosensitive printing element mounted onto a cylindrical support. But for each diameter of the sleeve possible for cylindrical printing elements either an extra support cylinder, i.e., drum or airshaft, needed to be fitted into the thermal processor, or the support cylinder needed to be fitted with a special adapter sleeve or sleeves. Replacement of the support cylinder in the thermal processor to accommodate different diameter sleeves is impractical since this would involve considerable downtime in the operation of the processor and cost in tooling for the processor.

An apparatus and process for thermally treating cylindrical photosensitive elements is disclosed in U.S. Pub. No. 2006/0104675. The process treats a photosensitive element having a cylindrical support and a composition layer adjacent the support opposite an interior surface of the support, the composition layer capable of being partially liquefied. During thermal processing, the cylindrically-shaped photosensitive printing element is held between a first supporting means and a second supporting means, and a hot roll is brought adjacent the first supporting means. The cylindrical photosensitive element is not firmly fixed on a supporting means, but it is processed in a so-called "loose-fit" mode. In loose-fit mode, the cylindrical photosensitive element is not fully contacted or supported by the supporting means; and only a part or parts of the interior surface are in contact with or supported by the supporting means.

However, a problem may arise in an apparatus for thermal treating cylindrical elements in that the heat energy transferred to the composition layer of the photosensitive element may differ according to the diameter size and/or stiffness of the cylindrically-shaped photosensitive element, as different elements are subsequently treated in the apparatus. The differing heat energy transferred to the composition layer can influence the removal of the molten material from the composition layer, such that the resulting printing form can have undesired non-uniformities in the relief surface.

So, thermal development of cylindrical photosensitive printing elements with different diameters on commercial processors is difficult, time consuming, and expensive.

SUMMARY OF THE INVENTION

The present invention provides an apparatus for forming a printing form from a photosensitive element having an exterior surface and a composition layer capable of being partially liquefied. The apparatus includes a displaceable heater for heating the composition layer at a predetermined distance from the exterior surface, means for removing at least a portion of the composition layer from the element, and means for displacing the displaceable heater to the predetermined distance from the exterior surface.

In accordance with this invention there is also provided a process for forming a printing form from a photosensitive element having an exterior surface and a composition layer capable of being partially liquefied. The process including heating the composition layer with a displaceable heater at a predetermined distance from the exterior surface; removing at least a portion of the composition layer from the element; and displacing the displaceable heater to the predetermined distance from the exterior surface.

DETAILED DESCRIPTION OF THE PREFERRED EMBODIMENTS

Figure 1:
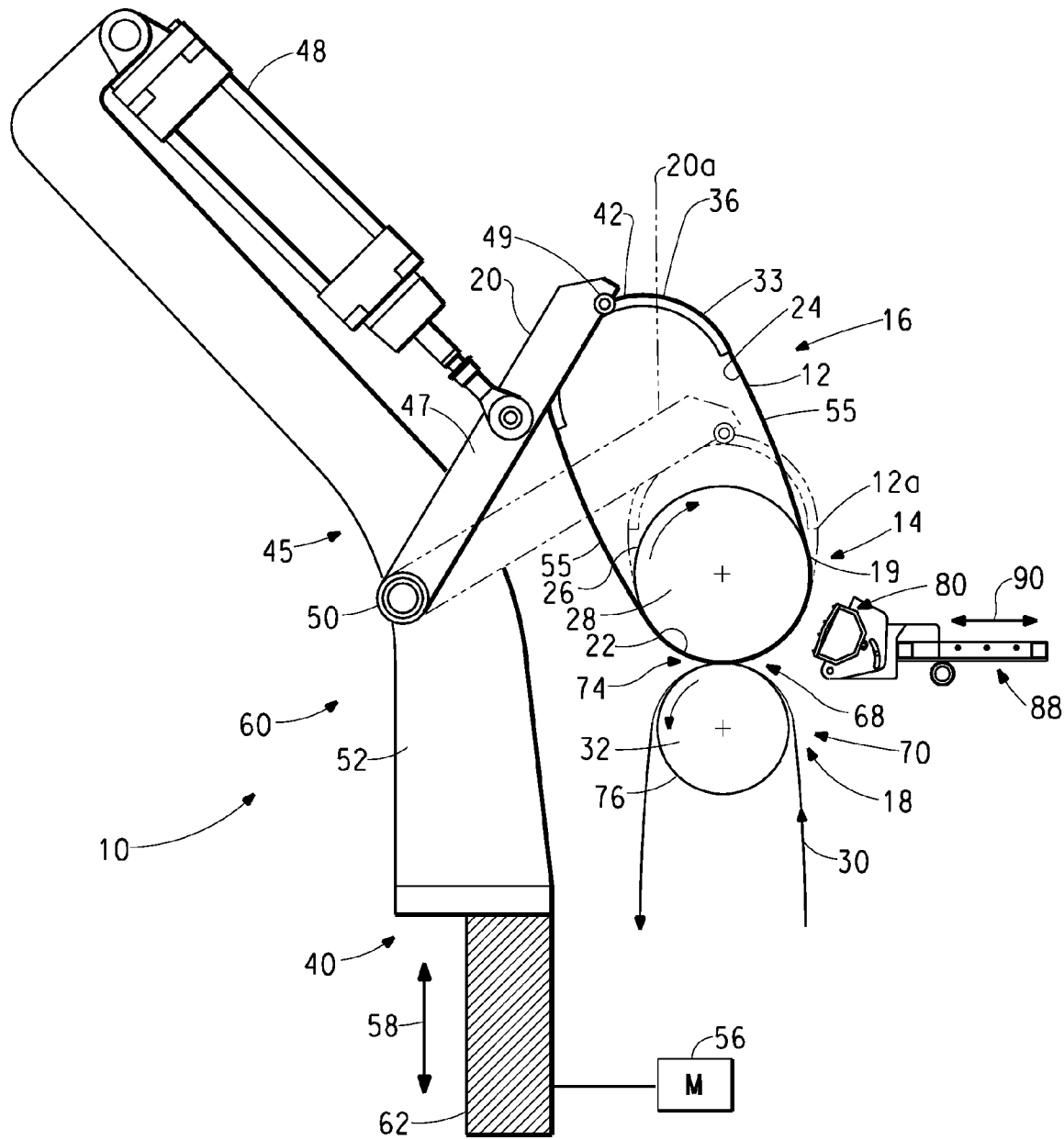
FIG. 1 is a schematic cross-sectional view of one embodiment of an apparatus for forming a printing form from a cylindrical element showing a first means for supporting the element by contacting a first part of the element, a displaceable heating means for heating the element, and a means for treating an exterior surface of the element opposite the support with a development medium.

The present invention provides the capability for adjusting heating in an apparatus and a process for forming a printing form from a photosensitive element having at least one composition layer capable of being partially liquefied on a support. The present invention is contemplated for use in an apparatus capable of heating the photosensitive element to a temperature sufficient to melt or soften or liquefy at least a portion of the element to create a relief structure suitable for printing with a flexographic printing form.

In accordance with one embodiment the apparatus and process thermally develops photosensitive elements having an association with a cylindrical shape or substantially cylindrical shape. That is, the support for the photosensitive element itself may be cylindrical like, or the photosensitive element may be grouped with at least one other structure that is cylindrically shaped. Since the resulting printing form is ultimately mounted onto a printing cylinder, the shape of the support or structure is generally cylindrical. However, the element may not be cylindrical or may only be substantially cylindrically shaped while in operative engagement in the present apparatus and process or when not mounted onto the printing cylinder. The cylindrically-shaped support or structure may also be referred to as a sleeve. The photosensitive element may include a continuous, seamless or substantially seamless, photopolymerizable composition layer adjacent to or on the cylindrically-shaped support. The photosensitive element can also encompass plate-on-sleeve system. Typically, plate-on-sleeve is a photosensitive element that includes at least the composition layer on a planar support, i.e., a plate, which is then mounted onto a cylindrically-shaped support. Ends of the plate may or may not meet or join when wrapped onto the sleeve. Plate-on-sleeve also includes an embodiment in which more than one plate, or portions of plates, are mounted onto a sleeve at various spaced locations. Also contemplated as the photosensitive element is a photosensitive plate having at least one photopolymerizable composition layer preferably on a base support, which is formed into a cylinder by butt joining both edges. The plate edges can be joined by any method including, but not limited to, melt fusing, taping, stitching, clamping, stapling, taping, gluing, and sewing. In this embodiment the base support would become the cylindrical support. Any of the embodiments described above may be referred to as cylindrical photosensitive elements, or cylindrical printing forms, or photosensitive elements. The photosensitive element includes a cylindrical support and a composition layer. The cylindrically-shaped element has an interior surface having an interior diameter and an interior circumference (i.e., the perimeter of the interior surface). The cylindrically-shaped element is tubular, i.e., a hollow elongated cylinder. The cylindrically-shaped element has an axial length taken along a longitudinal axis running through the hollow of the element. The axial length of the cylindrically-shaped element may also be referred to herein as a width of the element.

The present invention can be used in apparatuses to provide an easy way to process cylindrical photosensitive elements having different diameters (that is, interior circumferences) on the same apparatus without the need for a specific support cylinder, i.e., drum, for each diameter. This provides considerable advantages in the reduction of tooling for the apparatus and the simplification of the thermal development process. In addition the use of special adapter sleeves for each diameter is not necessary, but an optional feature. Furthermore, the present invention provides an easy and economical way to prepare cylindrical printing forms with different repeat lengths from cylindrical photosensitive elements having different diameters. The repeat length of a particular cylindrical photosensitive element is the distance from start to end of an image region on a printed substrate before the image region is repeated on the printed substrate. The repeat length can also be considered a circumference of the exterior surface, that is the exterior perimeter (length), of the photosensitive element. The present invention provides the apparatus and process with the capability to easily adapt a means for heating the photosensitive element according to the particular type or characteristic of the cylindrical photosensitive element being treated so that the uniformity of the removal of liquefied material from the element is improved and the reproducibility of the removal from element to element is improved.

Processes for thermally developing the photosensitive element are disclosed by Peterson et al. in U.S. Pat. No. 5,279,697, and also by Johnson et al. in WO 01/18604. Both references show that the photosensitive element, i.e., a planar flexographic printing element, can be placed on a planar surface or on a drum for thermal treatment. But in contrast to these processes, in one embodiment of the present invention the cylindrical photosensitive element is not fully supported during thermal development. The cylindrical photosensitive element is only partially supported by a first support means and an optional second support means of the apparatus. A feature of the apparatus and process is that the cylindrical photosensitive element is not firmly fixed on a supporting cylinder, such as a drum, during thermal processing, but it is processed in a so-called "loose-fit" mode. In loose-fit mode, the interior surface of the cylindrical support of the photosensitive element is not fully contacted or supported by a supporting cylinder; and only a part or parts of the interior surface are in contact with or supported by a supporting means. That is, one, or two or more parts of the interior surface circumference of the cylindrical support are contacted by or supported with the support means, such that the photosensitive element resides about the support means in a band-like fashion. The cylindrical support has between the supported parts one or more parts of the interior surface that are unsupported. Although one skilled in the art would expect that incomplete support of a cylindrical photosensitive element during thermal development would result in defects in the printing form and/or in its relief surface, the present apparatus and process surprisingly provides flexographic printing forms with a printing surface without defects caused by insufficient development or deformation of the relief surface. The loose fit mode is particularly useful for thermal processing of photosensitive elements in which the cylindrical support is a flexible sleeve and includes a continuous photopolymerizable layer on the sleeve. In an alternate embodiment, the cylindrical photosensitive element can be fully supported during thermal development, by a roller, drum, or adapter mounted onto a roll or shaft.

FIG. 1 is a schematic illustration of one embodiment of an apparatus 10 for forming a printing form from a cylindrical photosensitive element 12. For the sake of simplicity, the cylindrical support, cylindrical photosensitive element, and the cylindrical element will all be referred to as feature 12. The apparatus 10 for forming printing forms includes a first means for supporting 14 the photosensitive element 12, a second means for supporting 16 the photosensitive element 12, a means for treating 18 an exterior surface 19 of the photosensitive element 12 opposite the support, and a displaceable heating means 80 for heating the exterior surface of the element. FIG. 1 depicts thermal processing of two cylindrical photosensitive elements 12 and 12a each having a different diameter (that is, a different interior circumference) on the same apparatus 10 without the need for a separate support drum or roller 28 for each element. The second supporting means 16 is in a first position 20 to support a first cylindrical photosensitive element 12. Shown in phantom, the second supporting means 16 is in a second position 20a to support a second cylindrical photosensitive element 12a. The interior circumference of the cylindrical support for the first photosensitive element 12a is smaller than the interior circumference of the cylindrical support for the second photosensitive element 12.

An alternate embodiment of an apparatus for forming printing forms includes a means for supporting the cylindrical element, which can be either of the first means for supporting 14 or the second means for supporting 16 the element, and a means for treating 18 an exterior surface of the cylindrical element. In most cases of the alternate embodiment, the first means for supporting 14 is suitable for the means for supporting the cylindrical element.

The first means for supporting 14 the photosensitive element 12 contacts a first part 22 of the interior surface 24 of the photosensitive element 12. A part (i.e., the first part 22) or segment of the interior circumference of the photosensitive element 12 is contacted by the first support means 14 to support or buttress the element while the softened, melted, or liquefied portions are being removed during treating. The first support means 14 includes an outer surface 26 having an arcuate shape that contacts the first part 22 of the interior surface 24 of the photosensitive element 12. The first support means 14 is not limited and can include, for example, a drum, a roller, a mandrel, and a platform member. In the embodiment shown the first support means 14 is a roller 28 mounted for rotation on a first sub-frame (not shown) of the apparatus 10. One end of the roller 28 is secured in the first sub-frame and the other end of the roller can disengage from the sub-frame or a beam member, so that the roller cantilevers from the secured end for loading and unloading of the cylindrical support 12.

With the present apparatus and process, all repeat lengths between a minimum and a maximum repeat length can be thermally developed without any adapter sleeve, particularly for thin flexible photopolymer sleeves. However a greater maximum repeat length can be accomplished with the use of an adapter sleeve (not shown) mounted onto the roller 28 of the first supporting means 14. The adapter sleeve can provide an alternative surface for the roller to aid in the development process. The adapter sleeve also can provide a resilient or compressible surface that assists in relief formation in the photosensitive element. In one embodiment, the roller 14 is an air-shaft having radial passages for supplying air to the outer surface 26 of the roller. The air supplied to the outer surface 26 facilitates movement of the optional adapter sleeve axially along and rotationally about the roller 28. The apparatus may include a pneumatic system that in one embodiment is connected typically to an end of the air-shaft to supply the air from a pressurized air source or generator to a cavity in the roller 28 and through the passages to the outer surface 26. It is well known within the skill of the art to contemplate alternate embodiments of supplying air to the outer surface 26.

The optional adapter sleeve is mounted onto the air-shaft the same way or similar to the mounting of a printing sleeve or a bridge sleeve onto a printing cylinder. The air at the outer surface of the air-shaft creates a cushion that expands the adapter sleeve to the extent that the sleeve can slide along and rotate about a longitudinal axis of the roller. Once the adapter sleeve is in position on the air-shaft, the air supply is turned off and the sleeve contracts to have an interference fit with the roller. When the adapter sleeve is in use for thermal development, the interior surface of the cylindrical photosensitive element contacts an outermost surface of the adapter sleeve. The adapter sleeve should have a uniform thickness and is not limited to any particular structure. Any sleeve or bridge sleeve suitable for use on printing cylinders may be used as the adapter sleeve. In one embodiment the adapter sleeve is a thin support sleeve having a total thickness of 10 to 15 mm, and preferably 12 to 14 mm. In another embodiment the adapter sleeve includes on its outer surface a layer of a compressible material, preferably a layer of resilient material, such as, for example polyurethane foam. The compressible layer or resilient layer preferably has a thickness up to 6 mm, most preferably up to 3 mm.

In an alternate embodiment, the outer surface 26 of the first support means 14, that is the roller 28, may be modified or include one or more layers to provide additional functionality to the outer surface, such as resiliency, tackiness, protection, etc. The additional layer as a resilient layer can be composed of any material to suitable to provide a Shore A hardness between about 30 and about 75, such as natural rubbers and elastomeric materials and synthetic rubbers and elastomeric materials, including rubber, silicone rubber, and compressible foams. Particularly preferred are silicone rubber and rubber. The hardness of the layer is important, although not critical to the invention. The resilient surface provided by the resilient layer can result in a longer nip zone as a result of the surface deflecting under the pressure exerted by the treating means. The rubber elasticity also accommodates some minor misalignment between the roller and the treating means. The resilient layer can include metal particles, such as aluminum particles, to improve the heat transfer characteristics of the roller.

In one embodiment, the roller 28 or air shaft is rotated so that a speed of the surface of the photosensitive element 12 (surface speed) is synchronized to a speed of a web of a development medium 30 in contact with the photosensitive element 12. The roller 28 supporting the cylindrical photosensitive element 12 and a heated roll 32 delivering the development medium 30 are independently driven by motors (not shown) to avoid inducing high shear or slip conditions on the surface of the photosensitive element. Alternate configurations are possible in which the heated roll 32 is not driven. The development medium 30 is pulled through (from unwind, passing over heated roll, to windup) the apparatus. The speed of the web of the development medium 30 is regulated by drive rollers that are past the transfer nip point and the tension of the web entering the nip is controlled by means of braked rollers upstream of the transfer nip point. In alternate embodiments of the first support means 14 that do not rotate, such as a platform member, it is within the skill of those in the art to include comparable means to synchronize the surface speed of the photosensitive element 12 with the speed of the web of the development medium 30.

The second means for supporting 16 the cylindrical photosensitive element contacts a second part 33 of the interior surface 24 of the photosensitive element 12. The second part 33 is different from the first part 22 of the interior surface 24. The part 33 or segment of the interior circumference of the photosensitive element 12 is contacted by the second support means 16 to support or tension the element during treating. The second support means 16 includes an outer surface 36 having an arcuate shape that contacts the second part 33 of the interior surface 24 of the cylindrical support 12.

The second support means 16 is not limited and can include for example, a drum, a roller, a mandrel, and a platform member. The second support means 16 is mounted on a carriage assembly 40 on the first sub-frame (not shown) of the apparatus. In one embodiment the second support means 16 is a roller that is mounted for rotation on the carriage assembly 40. In the embodiment shown, the second support means 16 is a platform member 42 having a cross-sectional arcuate shape providing an arcuate outer surface 36. The second part 33 of the interior surface 24 of the cylindrical support 12 contacts the arcuate surface 36 of the platform member 42, when the cylindrical photosensitive element 12 is in place for thermal development.

The platform member 42 can be unitary and have a fixed curvature of its arc as shown. This embodiment is particularly suited for flexible cylindrical supports of a photosensitive element 12 that can readily conform to the arcuate shape of the platform member 42. Alternatively the platform member 42 can be segmented in at least two parts. The segmented parts may be flexibly coupled together, by for example a flexible band, to allow the platform member 42 to change the curvature of its arc. A segmented platform member 42 is particularly useful for thermally developing photosensitive elements that include a "stiff" cylindrical support. The segmented platform member 42 can better conform to the inner surface of the cylindrical support, increasing the contact of the outer surface of the platform member to the cylindrical support and thus facilitating the control of the position of the cylindrical support. A stiff cylindrical support is any support that does not sufficiently flex or conform to a fixed curvature of the platform member. Stiff cylindrical supports may have one or more factors which prevent or reduce its ability to conform to a different arcuate shape, such as, but not limited to, its wall thickness, its diameter, and materials of construction. For example, a cylindrical support formed of glass fiber reinforced resin and/or having a wall thickness on the order of 600 micron can be stiff enough not to conform to the arcuate shape of the platform member (and roller) when in operating position in the present apparatus. One or more of the segments of the segmented platform member, or the flexible band may include a cavity for temperature controlling fluids to traverse.

The outer surface 36 of second support means 16 in its entirety or in part may be provided with a material that reduces friction, such as TEFLON® fluoropolymer. Contact of the interior surface 24 of the photosensitive element 12 with the outer surface 36 of the second support means 16 can cause friction that may prevent or inhibit rotation of the cylindrical element during thermal development. The friction-reducing material (i.e., an anti-stick material) allows for the cylindrical support 12 to easily traverse the outer surface of the second support means 16 during thermal development.

The interior surface 24 of the photosensitive element 12 contacts at least a portion of the outer surface 36 of the second support means 16, and preferably the interior surface contacts the entire outer surface of the second support means. Contact between the interior surface 24 of the photosensitive element 12 and the outer surface 36 of the second support means 16 should be sufficient to help to manage the temperature of the photosensitive element 12 and to control the movement of the cylindrical support during thermal development. For instance during thermal development, it may be beneficial to keep the temperature of the cylindrical support of the photosensitive element lower than the temperature of the composition layer, to minimize or prevent distortion of the cylindrical support. Distortion can come about when there is a mismatch between the shrinkage characteristics of the cylindrical support and the temperature the composition layer must be raised to for thermal development in the process. A support with a high shrinkage (or low dimensional stability) at the developing temperature of the composition layer must be maintained at a temperature much less than the developing temperature of the composition layer during the heating process. It may also be beneficial to maintain the temperature of the photosensitive element so that its temperature does not increase beyond the temperature necessary for development. Contact between the cylindrical support 12 and the second supporting means 16, particularly when the second supporting means includes a means for cooling, helps to effectively remove heat retained in the photosensitive element and maintain the element at desired developing temperature/s. Further, it is desirable to maintain sufficient contact between the interior surface 24 of the cylindrical support 12 and the outer surface 36 of the second supporting means 16, in order to eliminate or reduce any forces causing lateral movement of the cylindrical element along the first supporting means 14, i.e., the roller 28, and/or the second supporting means 16, i.e., the platform member 42.

The present apparatus determines the minimum and maximum perimeter (length) of the interior surface 24 of the photosensitive element 12 that can be thermally developed. The minimum size of the interior perimeter of the element is determined from the length of the outer surface of the first support means (or second support means), such as a circumference of the roller. The maximum size of the interior perimeter of the element is determined by the total distance from the outermost position of the outer surface of the second support means and to the outer surface of the first support means outermost from the second support means.

In the embodiment shown, the apparatus 10 includes a means for moving 45 the second means for supporting 16. The means for moving 45 moves the second support means 16 into position for loading and unloading of the photosensitive element 12 from the apparatus 10 and for supporting in tension the cylindrical support for thermal development. The means for moving 45 can also be considered a means for tensioning the photosensitive element 12 between the first support means 14 and the second support means 16. For thermal development the means for moving 45 positions the second support means 16 to extend the cylindrical support 12 into a non-cylindrical shape and hold taut the cylindrical photosensitive element in relative tension between the first support means 14 and the second support means 16. The non-cylindrical shape depends on the stiffness and the size respectively the diameter of the photosensitive element 12.

The means for moving 45 includes a moving assembly that comprises at least an arm 47 and an actuating device 48. An arm 47 is coupled at each axial end of the second support means 16, that is the platform member 42 in FIG. 1. One axial end of the platform member 42 is demountably coupled to one end of a first arm 47 with a removable fastener such as a screw or locking pin. The opposite axial end (not shown) of the platform member 42 is attached to one end of a second arm. For loading and unloading of the photosensitive element 12, the first arm 47 uncouples from the platform member 42 by removing the fastener 49 and pivots away from the platform member. The platform member 42 cantilevers from the attached end of the second arm while the cylindrical support 12 is mounted or dismounted from the apparatus 10. For both the first arm 47 and second arm, an end 50 of the arm 47 opposite the end coupled to the second support means 16 is pivotally connected to a carriage 52 of the carriage assembly 40.

The arm 47 is mounted so that the arm can pivot about and position the platform member 42 to accommodate different photosensitive elements 12 of different diameters. Between the two ends, the first arm 47 is coupled to an end of the actuating device 48. Similarly, the second arm is coupled to an end of a second actuating device. The actuating devices 48 operate in tandem to move the second supporting means 16. Although it is within the skill of those in the art to provide alternate embodiments of the means for moving 45 the second supporting means 16, the embodiment described provides easy access to the entire axial length of the second supporting means for mounting and dismounting of the cylindrical support 12.

In FIG. 1, the arm 47 is shown in two positions, one position 20 which tensions a first photosensitive element 12 having large diameter (or internal circumference) between the first support means 14 and the second support means 16, and in a second position 20a (shown in phantom) which tensions a second photosensitive element 12a of a smaller diameter between the first support means 14 and the second support means 16.

An end of the actuating device 48 opposite the arm 47 is coupled to an end of the carriage 52. The actuating device 48 is not limited and can include linear actuators, such as pneumatic or hydraulic cylinders, or stepping motors. The actuating device 48 moves the arm 47 positioning the second support means 16 sufficiently close to the first support means 14 so that the cylindrical photosensitive element 12 can be loaded onto (or unloaded from) the first and second supporting means. The second support means 16 is sufficiently close when the interior circumference 24 of the photosensitive element 12 is larger than the sum of a length (arc) of the outer surface 26 of the first supporting means 14 that would contact the cylindrical support, a length (arc) of the outer surface 36 of the second supporting means 16 that would contact the cylindrical support of the photosensitive element, and a total length of any gaps intervening between the first and second supporting means 14, 16. In the load and unload positions the photosensitive element 12 surrounds the first and second supporting means 14,16 and possibly a part of the interior surface 24 of the cylindrical support of the photosensitive element contacts the outer surface 36 of the second support means 16. The cylindrical photosensitive element 12 is readied for thermal development when the actuating device 48 moves the arm 47 and the second support means 16 away from the first support means 14 so that the cylindrical photosensitive element is held relatively taut between the first and second supporting means. The first part 22 of the interior surface 24 of the photosensitive element 12 contacts at least a portion of outer surface 26 of the first supporting means 14 and, the second part 33 of the interior surface 24 of the cylindrical support of the photosensitive element different from the first part 22 contacts at least a portion of the outer surface 36 of the second supporting means 16. In this embodiment, the first part 22 and the second part 33 of the interior surface 24 of the photosensitive element 12 are opposite or substantially opposite each other. The photosensitive element 12 is held relatively taut between the first and second supporting means 14,16 because the interior surface 24 of the cylindrical support has unsupported parts 55 between the first and second parts 22,33 that are not contacted by the first and second support means 14,16, and thus the element is in loose-fit mode on the apparatus 10. The pressure in the actuating cylinder/s 48 can be controlled during thermal development to assure that the second support means 16 maintains constant or substantially constant tension in the photosensitive element 12 while minimizing mechanical stresses on the element and accounting for thermal expansion of the element. Maintaining tension on the photosensitive element 12 helps to avoid transverse (lateral) movement of the cylindrical support along the longitudinal axis of the first support means 14, that is the roller 28. The pressure in the actuating devices 48 is set so as to maintain contact of the interior surface 24 of the cylindrical support of the photosensitive element with the outer surface 36 of the second supporting means 16, but not so high as to as to distort the cylindrical support or element at the elevated temperatures associated with thermal development. For instance, the pressure for an air cylinder having a 3 inch diameter is between 1 and 2 bars. It should be understood that during thermal development the first part 22 and second part 33 can be a different part of the interior surface 24 from one instant of time to the next since the cylindrical support 12 rotates about the first and second support means 14,16.

The carriage assembly 40 is secured to the first sub-frame of the apparatus 10 and includes the carriage 52 and an actuator or actuating mechanism 56. The carriage 52 is an upright beam mounted for movement onto the actuator or actuating mechanism 56. The second means for supporting 16 and the means for moving 45 are mounted onto the carriage assembly 40. Although not shown in FIG. 1, the first means for supporting 14 is also mounted onto the carriage assembly 40. The actuator or actuating mechanism 56 moves the carriage beam 52 vertically or substantially vertically, according to arrow 58, carrying the first support means 14 and the second support means 16 to position the cylindrical photosensitive element 12 adjacent to the treating means 18 for thermal development and to position the element away from the treating means for loading and unloading of the element. In one embodiment, the carriage assembly 40 is a means for delivering 60 the photosensitive element 12 to the treating means 18, and particularly to the development medium 30. On each side of the carriage beam 52, an end opposite the actuating device 48 is mounted onto a spindle driven with a motor (not shown) to rotate the spindle and thereby raise and lower the carriage beam.

An alternate embodiment is also contemplated in which the apparatus 10 includes a means for moving the first means for supporting cylindrical 14. In one embodiment, the means for moving the first support means 14 can be used by itself, that is, the means for moving can position the first support means to load and unload the cylindrical support 12 and to tension the cylindrical photosensitive element as was described above for the means for moving 45 the second support means 16. The second support means 16 would remain stationary during these operations. In an alternate embodiment, the means for moving the first support means 14 can be used in conjunction with the means for moving 45 the second support means 16 for quicker positioning of the first and second support means. The means for moving the first support means 14 can be similarly mounted to the carriage assembly 40 as was described above. It is well within the skill of those in the art to contemplate alternative means for moving the first support means 14, the second support means 16, or both the first and second support means to accomplish loading and unloading of the cylindrical support and tensioning of the cylindrical photosensitive element.

The apparatus 10 may include at least one means for changing a temperature (not shown) of the first support means 14 and/or a temperature of the second support means 16. In particular, the means for changing alters the temperature of the outer surface 26 of the first support means 14 and/or the temperature of the outer surface 36 of the second support means 16. Thermal development heats the cylindrical photosensitive element 12 to a development temperature or temperature range suitable for the uncured portions of the composition layer to liquefy, i.e., melt or soften or flow. It may be necessary to change the temperature of each of the first and second support means 14,16 in order to establish and/or maintain the cylindrical photosensitive element 12 at the desired the development temperature or temperature range. Depending upon various factors including but not limited to the thermal inertia of the material making up the photosensitive element, the desired development temperature or temperature range, the forming relief structure, the thermal development cycle, it may be necessary to heat or cool the cylindrical element to attain desired characteristics. The means for changing the temperature can include a means for heating, a means for cooling, or a means for heating and cooling. The first supporting means 14 and the second supporting means 16 each may include a cavity interior to the structure, and preferably adjacent to a wall forming the outer surface 26,36 where the means for changing the temperature may be located. Means for heating may be provided to keep the cylindrical photosensitive element 12 at a stable starting temperature independent of the surrounding environment, or to pre-heat the element in preparation for thermal development. Any means for heating, such as a heater or an electrical heating blanket, is acceptable so long as the power capacity of the heater is sufficient to maintain the temperature of the outer surface fairly constant. Means for cooling may be provided to maintain the photosensitive element 12 at a relatively stable temperature during thermal development. The means for cooling is not limited and can include forced circulating fluids, such as water or oil, through the cavity. Although not preferred cooling gases, such as air, can be used but offer limited capacity to cool and remove heat from the system. In one embodiment, water is particularly effective to be circulated through the cavity to accomplish heating and/or cooling. In a preferred embodiment, cool water is circulated through a cavity in a platform member and a cavity in the roller to maintain the temperature of the cylindrical photosensitive element 12 during thermal development and/or to sufficiently cool the cylindrical support to reduce or eliminate thermal distortions to the support. While it may be useful, and perhaps even necessary under some circumstances to heat the first supporting means 14 and/or the second supporting means 16, the preferred embodiment cools at least the second supporting means. The apparatus 10 may include a temperature control system, such as a thermostat for the cooling or heating fluid, as a means to control the temperature of the first and second supporting means 14, 16.

Temperature sensors may be mounted throughout the processor to monitor the temperature for the purpose of controlling the temperature of the heating and/or cooling elements in the first supporting means, the second supporting means, the treating means, and the additional heating means.

The present apparatus 10 further includes the means for treating 18 the exterior surface 19 of the photosensitive element 12 by heating to a development temperature suitable for the uncured portions of the composition layer to liquefy, i.e., melt or soften or flow. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454.

In one embodiment, the means for contacting 68 the development medium 30 to an exterior surface 19 of the photosensitive element 12 opposite the support may be accomplished by the means for delivering the photosensitive element to the development medium. In this embodiment, the means for delivering is the carriage assembly 40. In an alternate embodiment, the means for contacting 68 may be accomplished by a means for supplying 70 the development medium 30 to the photosensitive element 12. In yet another embodiment, the photosensitive element 12 and the development medium 30 can be brought into contact by both the means for supplying and the means for delivering.

In one embodiment, the means for supplying 70 the development medium 30 is the roll 32 carrying the medium to the exterior surface of the photosensitive element. The roll 32 is mounted for rotation in a second sub-frame (not shown) of the apparatus 10 and located adjacent the first supporting means 14. In one embodiment, the roll 32 does not move relative to the first means for supporting 14 and the means for delivering, that is the carriage assembly 40 moves the first supporting means 14 toward the development medium 30. In an alternate embodiment, the means for supplying 70 the development medium 30 can be accomplished, for example, by mounting the roll 32 onto arms attached to a beam that moves the roll under the urging of one or more actuators. Alternative means for moving the roll 32 to supply the development medium 30 is well within the skill of those in the art. Suitable for use as one or more actuators can be air cylinders, or stepping motors, or servo motors. When the development medium 30 and the exterior surface 19 of the photosensitive element 12 are brought into contact by the means for contacting a nip 74 is formed between the roll 32 and the roller 28.

In FIG. 1 the means for supplying 70 the development medium 30 is the heated roll 32 or hot roll that supplies a continuous web of the development medium to the photosensitive element 12. The hot roll 32 maintains or further elevates the temperature of the exterior surface 19 of the composition layer. The hot roll 32 thus also functions as a means for heating the photosensitive element 12 as well as a means for supporting the development medium 30. As the continuous web of the development medium 30 passes over the hot roll 32, the temperature of the element 12 is rapidly elevated to a temperature that exceeds the melt temperature of the composition layer. In a preferred embodiment, heat is provided to the hot roll 32 by a core heater, such as a cartridge heater. The core heater is selected to have dimensions and power to provide sufficient energy to maintain a skin temperature of an outer surface of the hot roll 32 to melt a portion of the composition layer through the web. Typically the skin temperature is between about 120 to 200° C., and preferably between 140 and 170° C. Alternate embodiments contemplated to heat the hot roll 32 include the use of steam, oil, hot air, and a variety of other heating sources to provide a skin temperature sufficient to melt a portion of the composition layer through the web. The hot roll 32 is preferably metal having an outer surface that may be coated with a layer of an elastomeric material. The hot roll 32 may be crowned, that is a diameter of the roll increases from side edge to center, or may be a straight roll. If the hot roll 32 is a straight roll, the hot roll may optionally be supported on its backside, i.e., the side opposite the nip, with one or more heat resistant rollers to counter possible deflection of the straight roll along the nip, particularly when in pressing contact with the photosensitive element.

In one embodiment, the hot roll 32 is driven by friction between its outer surface 76 and the continuous web 30 contacting the hot roll. In an alternate embodiment, the hot roll 32 and roller 28 are each independently driven with a servomotor in order to synchronize a linear speed of the exterior surface of the photosensitive element on the roller and a linear speed of the web transporting on the outer surface of the hot roll. In this embodiment the linear speed of the hot roll, the web, and the photosensitive element be substantially the same to avoid or minimize any shear stress on the element. Such stress may cause uneven relief depth and a distorted image, which are undesirable.

The continuous web of development medium 30 is unwound from a supply roll, guided over the hot roll 32, and wound up on a take-up roll. The apparatus 10 may include one or more additional rolls to transport, guide, idle and/or tension the continuous web 30 as necessary through the processor. The web of the development medium 30 may be under tension control, velocity control, or a combination thereof for transport through the processor. In one embodiment a means for applying tension (not shown) to the development medium 30 includes drive roll having an abrasive outer surface to prevent slippage of the web and a torque motor that provides constant torque to the drive roll so as to apply a constant or substantially constant tension to the web. The tension required to remove the web from the element may change with each cycle or subsequent cycles of removing for a given photosensitive element. As such, a controller (not shown) for the torque motor can adjust the torque so that the tension in the web is accordingly changed. In an alternate embodiment, the processor may include a motor to pull the web 30 through the processor at a linear speed that is synchronized with a linear speed of the outer surface 19 of the element 12 on the roller 28. It is well within the skill of those in the art to contemplate alternative embodiments and include necessary components to accomplish desired control of the web transport through the processor. The supply roll, take-up roll, and the one or more additional rolls can be mounted for rotation on a frame of the processor or on the second sub-frame. The second sub-frame can be movable so that it can be rolled out of the frame of the processor when required for servicing.

The present apparatus 10 also include pressure means for causing the cylindrical photosensitive element 12 and the development medium 30 to come into contact at a pressure sufficient for at least a portion of the liquefied material of the composition layer to be absorbed by the development medium. When the hot roll 32 is adjacent the first supporting means 14, the nip 74 is formed between the photosensitive element 12 and the hot roll 32 with the development medium 30 between the element and the hot roll. The nip 74 is the location where the hot roll 32 carrying the web contacts the exterior surface 19 of the photosensitive element 12 supported by the roller 28. It is desirable to apply a uniform or substantially uniform pressure at the nip 74 across the width of the element 12 during processing. This uniform pressure assumes that the image across the nip is uniform; those skilled in the art will recognize that the pressure applied will vary locally as image elements pass through the nip. Pressure is applied to force the absorbent web into intimate contact with the photosensitive element. Pressure between about 0.70 kilograms per square centimeter and about 24 kilograms per square centimeter, preferably between about 2 kilograms per square centimeter and about 12 kilograms per square centimeter in the nip area is adequate to enhance the absorption from the element surface to the absorbent web without distorting the composite photosensitive element.

Alternative embodiments of the means for supplying 70 the development medium 30 such as those described as a means for supporting in U.S. Pub. No. 2006/0027113 are also contemplated. The means for supplying 70 can include embodiments in which a support member has a non-rotating surface that supports the development medium 30 in contact with the exterior surface 19 of the photosensitive element 12. The non-rotating surface of the support member has advantages as it reduces the costs and simplifies the manufacture, operation, and maintenance of the apparatus as well as the method of using the apparatus. The support member has a cross-sectional shape that is not limited, and can include, for example, elliptical, arcuate including convex and concave surfaces, parabolic, circular, semi-circular, wedge, triangular, rectangular, and other polygonal shapes. The shape of the support member can be symmetrical or asymmetrical. The support member may be solid or may include a cavity (not shown) to accommodate sources of heating the support member or for circulating a heated fluid. The support member can also have the cavity to minimize its weight and/or to minimize its thermal mass so as to have more rapid response to temperature changes or to minimize heat losses in undesired locations. The material/s of constructing the support member is not limited, and include, but are not limited to, sheet metal, cast metal, machined metal, alloys, polymer composite materials, thermoplastic materials, thermoset materials, and combinations thereof. The material chosen for the support member should be resistant to thermal distortion at the temperatures associated with thermal processing, and be able to resist displacement, i.e., bending and torsion, under the operating forces in the process.

Means for providing relative movement can be accomplished by moving any one of or a combination of the first supporting means 14, the second supporting means 16, and the treating means 18 towards and/or away from each other in order for thermal development to occur. Preferably the first and second supporting means 14,16 are movable independently of each other. The carriage assembly 40, the means for moving 45 the second supporting means 16, and the means for contacting 68 the photosensitive element 12 and the development medium 30 (which can include the means for delivering the photosensitive element, and the means for supplying the development medium) can be considered means for providing relative movement. Alternative means for providing relative motion between the photosensitive element and the development medium are described in U.S. Pat. No. 5,279,697 (Peterson et al.) and WO 2001/18604.

The first means for supporting 14 and the second means for supporting 16 are on the first sub-frame of the apparatus 10. Means for treating 18 including at least the hot roll 32 is on the second sub-frame of the apparatus 10. Each sub-frame is a removable module within the apparatus, such that essential elements of the apparatus can be quickly exchanged, and provide increased versatility to the apparatus. Each module can be exchanged with a backup module carrying the same essential elements for situations where the module needs maintenance or improvements, or with alternate modules carrying essential elements for processing different types of cylindrical elements.

The apparatus 10 includes at least one displaceable heating means 80 for heating the exterior surface 19 of the photosensitive element 12. Since the apparatus 10 is capable of treating various cylindrically-shaped photosensitive elements 12 having different diameters and stiffness, each of the photosensitive elements may be positioned on the first support means (and the second support means) at somewhat different orientations such that different heat energy may be transferred to each element by a heating means that does not contact the element. The displaceable heating means 80 provides the capability of adjusting the position of a non-contactable heating means relative to the orientation of the cylindrically-shaped photosensitive element 12, so that the heat energy transferred to each of the elements can be more uniform and/or controlled. The at least one displaceable heating means 80 can be used alone or in addition to the other means for heating, such as the hot roller, to heat the photosensitive element 12. In some embodiments, the displaceable heating means 80 heats the exterior surface 19 to a temperature sufficient to cause at least a portion of the layer to soften or liquefy. In some other embodiments, the at least one displaceable heating means 80 pre-heats the exterior surface 19 of the element. The displaceable heating means 80 applies heat to the exterior surface 19 of the photosensitive element 12 opposite the support, (that typically is the composition layer). In some embodiments, the displaceable heating means 80 applies heat to the exterior surface of the photosensitive element prior to removal of the uncured portions. In one embodiment, the displaceable heating means is adjacent to the contacting means 68 where the development medium 30 contacts the photosensitive element 12. The displaceable heating means 80 has a side that faces the exterior surface 19 of the element 12, referred to herein as the face side. The displaceable heating means is capable of heating the element without contacting the photosensitive element 12, e.g., by radiant heat. (It should be noted that the hot roller conductively heats the photosensitive element by contacting the development medium to the exterior surface of the photosensitive element, even though the contact of the hot roller to the photosensitive element is indirect.) Preferably, one or more infrared heating devices can be used as the additional heating means 80. Non-limiting examples of suitable displaceable heating means 80 are infrared heaters, and carbon heaters. The displaceable heating means 80 may also be referred to as a displaceable heater 80, or radiant heater/s 80. In some embodiments where the displaceable heating means 80 is used additionally with other means for heating, the displaceable heating means 80 may also be referred to as displaceable additional heating means 80, an additional heating means 80, or an additional heater 80.

As shown in the Figures, the apparatus 10 includes a means for displacing 88 the displaceable heating means 80. The displaceable heating means 80 is appropriately mounted in the apparatus, for example, on a cross-member secured to a frame or sub-frame of the apparatus. The Figures show one embodiment of the means for displacing 88 the displaceable heating means 80 which includes a support arm 82 and an actuating device 81. Attached to one end of the support arm 82 is the displaceable heating means 80. The support arm 82 is coupled to the actuating device 81 such that the support arm, with the displaceable heater 80, moves in the desired direction when the actuating device is activated. In one embodiment of the invention, the actuating device includes a gearwheel 83 driven by a motor (not shown). The gearwheel is meshed with a gear rack 84 or corresponding tooth means attached to the support arm 82. The gear rack 84 may be mounted to the support arm 82. Alternately, the gear rack 84 may be formed into a side of the support arm 82, providing a tooth flank profile of the support arm. The means for displacing can include a guiding means (not shown) for guiding the support arm 82. Rotation of the gearwheel 83 displaces the support arm 82 and the attached displaceable heating means 80. The actuating device can move the displaceable heating means 80 toward and away from the photosensitive element 12 as indicated by arrow 90. In this way, it is possible to move the displaceable heater 80 to a predetermined distance, d, and to adjust or control a distance between the displaceable heater 80 and the photosensitive element 12, i.e., the distance between the face side of the displaceable heating means 80 and the exterior surface 19 of the element 12. The means for displacing 88 the displaceable heating means 80 is not limited, and can include linear actuators, such as pneumatic or hydraulic cylinders, or motors, such as stepping or servo motors, appropriately coupled to the displaceable heater 80. For example, a spindle driven with a motor can be suitable for displacing the displaceable heating means 80.

In one embodiment, the apparatus includes a means for tilting the displaceable heater 80 wherein the displaceable heating means 80 is pivotally or tiltably attached to the support arm 82. The displaceable heating means 80 may include a housing 85 having an axis of rotation 86. The housing 85 includes an arcuate slit 87 which has its epicenter at the axis of rotation 86. A pin attached to the support arm 82 is inserted into the slit. In some embodiments, the pin may be a screw that fixes the housing 85 with the displaceable heater 80 mounted therein to an appropriately tilted position. In other embodiments, the means for tilting pivots or positions the displaceable heater 80 within the housing 85. In yet another embodiment of the means for tilting, the support arm 82 can be mounted on a cross-member such that the support arm with the displaceable heater 80 pivots or tilts to orient the displaceable heater is the desired position. In these embodiments, it is possible to arrange the displaceable heating means 80 so that the face side of the displaceable heater 80 is parallel or substantially parallel to the exterior surface 19 of the adjacent photosensitive element 12 in order to optimize heating of the photosensitive element 12 by the displaceable heater 80. In one embodiment, the housing 85 has a shape which serves as reflector for the radiation. Inside surfaces of the housing 85 may be coated for high reflectivity. In this way, the housing 85 can aid in directing heat generated by the displaceable heater 80 to emit from the face side of the heater.

According to the present invention, the means for displacing 88 the displaceable heating means 80 establishes a predetermined distance, d, between the additional heating means 80 and the photosensitive element to accommodate processing of different cylindrical elements of various types, thicknesses, and diameters. In one embodiment, the displaceable heating means 80 is set at the predetermined distance, d, from the cylindrical element 12 initially and remains in the same position (i.e., does not move) throughout the cycles of processing. In this case, the distance between the displaceable heating means 80 and the cylindrical element 12 may change throughout the process, and the distance between the displaceable heater 80 and the cylindrical element 12 at the end of the process may not be the same as the predetermined distance, d. In some embodiments, the means for displacing 88 the displaceable heating means 80 moves the displaceable heater 80 during one or more of the cycles of heating and removing the molten composition from the photosensitive element. The means for displacing 88 the displaceable heating means 80 incrementally can move the displaceable heater 80 to maintain the distance between the displaceable heater 80 and the cylindrical element 12 at or substantially at the predetermined distance, d. In this way, the means for displacing 88 the additional heating means 80 maintains the predetermined distance, d, between the face of the additional heating means 80 and the exterior surface 19 constant or substantially constant during removal of the molten composition from the photosensitive element. Surprisingly, it may not be sufficient to measure the temperature on the surface of the photosensitive element and to control heating dependent on the measured surface temperature in order to remove the molten composition from the photosensitive element in a very reproducible manner. Rather, maintaining the predetermined distance, d, constant or substantially constant throughout processing provides for very reproducible removal of the molten composition.

The apparatus may also include means for measuring the distance between the additional heating means 80 and the photosensitive element 12 and control means for keeping a constant distance between the additional heating means and the adjacent surface of the photosensitive element 12. For example, one or more sensors can be used with a programmable logic computer as the means for measuring the distance and the control means to maintain the distance constant. However in order to avoid expensive means for measuring the distance and control means, an alternate embodiment for controlling the displacement of the additional heating means 80 can be accomplished based upon a predetermined table of data.

The data, such as rate of removal of composition material based upon processing conditions at each cycle, are collected empirically with respect to possible different photosensitive elements. Before processing of the cylindrical element 12 by heating and removing the molten composition, the apparatus is provided with information on the type of the photosensitive element, especially with regard to the stiffness and the circumference of the photosensitive element. Afterwards, the displacement of the additional heating element 80 occurs in accordance with the corresponding data stored in the table.

In one embodiment, the means for displacing 88 the displaceable heating means 80 may move the displaceable heater 80 an additional displacement, or an incremental distance, between any one or multiple cycles of the process in order to maintain a constant or substantially constant distance between the displaceable heating means 80 and the adjacent (exterior) surface of the photosensitive element 12. In an embodiment of the invention, the displaceable heating means 80 is automatically displaced according to stored data after two cycles in order to keep a constant distance between the displaceable heater and the photosensitive element 12. Additionally, the radiant heat energy emitted by the displaceable heating means 80 may change between two cycles, preferably according to the data table, based on the type of the photosensitive element 12 in order to optimize the process. The radiant heat energy emitted can be changed by changing the power input to the displaceable heater 80. However, it is also possible optimize, and perhaps even accelerate, the removal process by measuring the temperature on the adjacent (exterior) surface of the photosensitive element and controlling the power to displaceable heating means 80 based on the measured temperature. However, changing the radiant heat emitted is only an additional optional method to optimize the process. According to one embodiment of the present invention, the reproducibility for the removal of liquefied composition material from the cylindrical element is accomplished by maintaining the distance between the displaceable heating means and the photosensitive element constant or substantially constant throughout the process.

In the embodiments in which the distance between the displaceable heating means 80 and the photosensitive element 12 is constant or at least nearly constant during the removal or separation of a molten composition, the unexposed portions of the photosensitive element can be separated or removed in a more reproducible manner compared with the state of art. Adjustment for changes in the type and format of the photosensitive element is easily accomplished by the means for displacing 88 the displaceable heating means 80 which provides the capability to maintain the distance between the displaceable heater and the photosensitive element constant at the predetermined distance, d. A first sleeve-like photosensitive element may differ due to the size and/or the stiffness of a second photosensitive element. These differences may change the distance between a displaceable heating means 80 and a photosensitive element. Also, since the physical characteristics of the photosensitive element can change during removal, adjustment of the additional heating means to maintain the predetermined distance can easily by accomplished by the means for displacing the additional heating means. According to the invention, different physical properties of photosensitive elements resulting in a different distance are compensated by a displacement of the displaceable heating means. Independent from the sizes or the stiffness or further mechanical properties, in some embodiments it is preferred that the predetermined distance between the displaceable heating means and the adjacent surface of the photosensitive element remains constant. Additionally, if the shape of the photosensitive element varies during the separation of a molten composition from the photosensitive element, the heating means is displaced in order to keep the distance to the surface of the photosensitive element constant or substantially constant. It may be sufficient to displace the displaceable heating means at the beginning and between any two cycles of removing an unexposed part of the photosensitive element.

Even though providing the apparatus with a means for establishing, and optionally maintaining, the predetermined distance between a surface of a photosensitive element and a heating means may increase the cost of an apparatus, the ability to consistently thermally process various photosensitive elements of different sizes and types at a predetermined distance appropriate for the photosensitive element assures the removal of molten composition in a reproducible manner, resulting in printing forms having improved uniformity of the relief surface.

Figure 2:
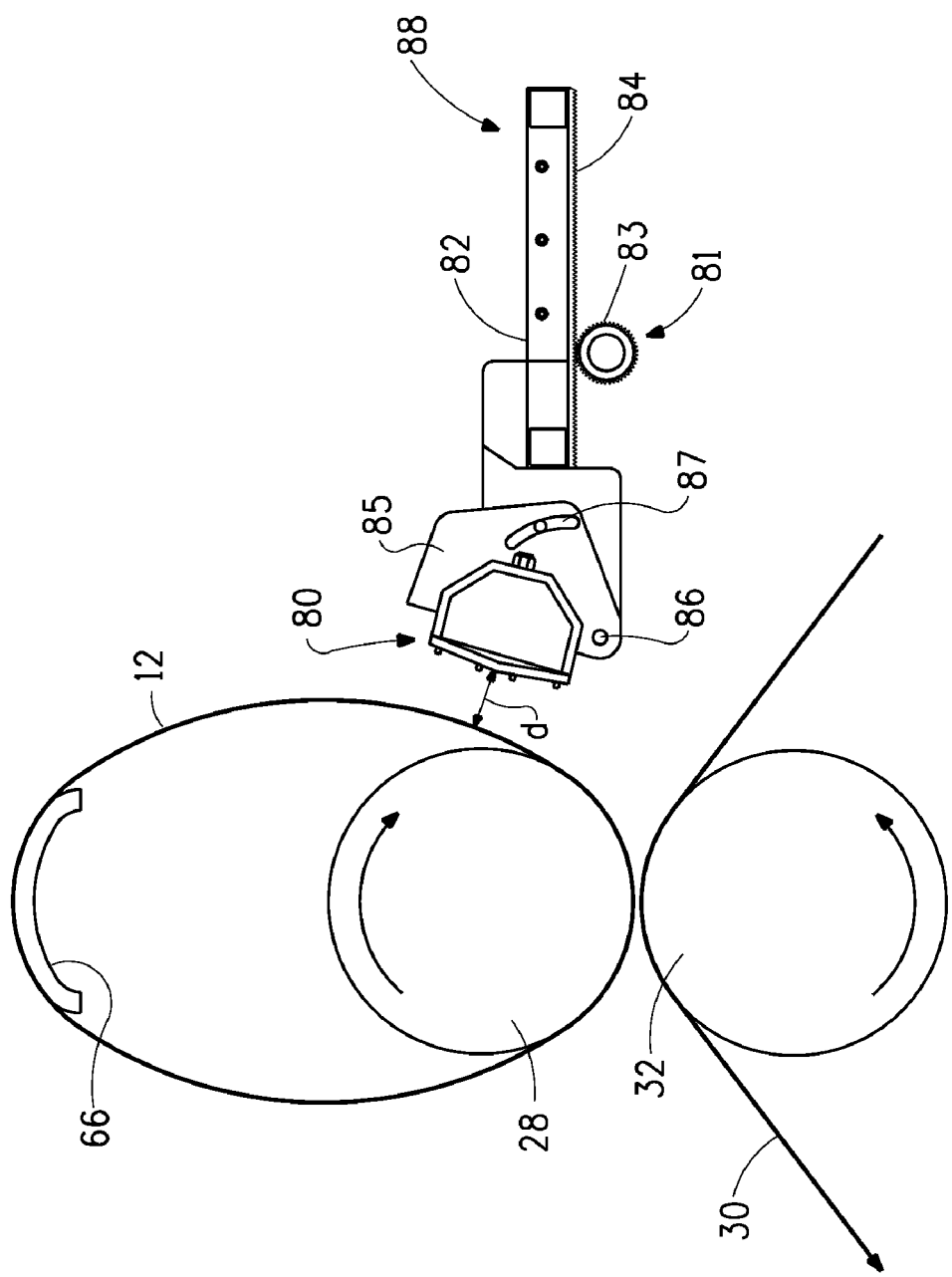
FIG. 2 is a schematic cross-sectional view of the apparatus showing one embodiment of the displaceable heating means for heating the element and one embodiment of a means for displacing the displaceable heating means.

The operation of the process for thermally developing the cylindrical photosensitive element will be explained relative to the embodiment shown in FIGS. 1 and 2. The process begins with placing the photosensitive element 12 that has been imagewise exposed about the first supporting means 14 (the roller 28) and the second supporting means 16 (the arcuate platform member 42). The means for moving 45 the platform member 42 is actuated to bring the platform member sufficiently close to the roller 28 so that the interior circumference of the photosensitive element 12 can fit about the platform member and the roller. One axial end of the platform member 42 is decoupled from the arm 47 by removing the removable fastener 49. The arm 47 is moved away and the platform member 42 cantilevers from its opposite end. Similarly, the same end of the roller 28 as the decoupled end of the platform member 42 is decoupled from the sub-frame, to cantilever the roller from its opposite end. If the optional adapter sleeve is to be used, the air to the roller is turned on, the adapter sleeve is slid over the roller, and the air is turned off. The cylindrical support 12 is axially slid over the platform member 42 and the roller 28. The roller 28 end support extending from the sub-frame is re-attached. The arm 47 is returned its coupling position with the platform member 42, and the fastener 49 is secured. The actuator 48 of the means for moving 45 moves the arm 47 and the platform member 42 away from the roller 28 until the cylindrical support 12 is tensioned between the platform member and the roller. In the tensioned position, the cylindrical support of the photosensitive element 12 is extended and held relatively taut into contact against the outer surface 36 of the platform member 42 and the outer surface 26 of the roller 28 opposite the platform member. When the photosensitive element 12 is in position for thermal development in the present apparatus 10, the first part 22 of the interior surface 24 of the cylindrical support 19 is in contact with at least a portion of the outer surface 22 of the first support means 14, and the second part 33 of the interior surface 24 of the cylindrical support 12 is in contact with at least a portion of the outer surface 36, e.g., arcuate surface, of the second support means 16. Also the cylindrical support of the photosensitive element 12 has one or more parts 55 of the interior surface 24 between the first part 22 and the second part 33 that are unsupported, that is, not contacted by one of the support means 14,16. The means for changing the temperature of one or more of the first and second supporting means 14,16 may be turned on to allow a temperature controlling medium, such as water, to transport through the cavity of the platform member and/or the roller 28 to (pre-) heat the cylindrical support of the photosensitive element 12.

The displaceable (radiant) heater 80 is turned on and is oriented rotationally and positionally according to the type of cylindrical photosensitive element being processed. The position of the displaceable heater 80 from the cylindrical element 12 is set to the predetermined distance, d, by rotating the gearwheel 83 which moves the support arm 82 along the gear rack 84 and the attached housing 85 for the radiant heater. The predetermine distance, d, is the distance between the exterior surface of the photosensitive element and a side of the displaceable heater facing the photosensitive element, i.e., face side. The rotational position of the displaceable heater 80 is set by loosening the pin or screw so that the housing 85 can be tilted via the slit 87, and the pin is tightened to secure the heater in the desired tilted position. Preferably the desired tilted position is one in which the face of the heater 80 is parallel to the exterior surface 19 of the cylindrical element 12.

The radiant heater may also be turned on to (pre-) heat the exterior surface 19 of the cylindrical photosensitive element 12. The radiant heater may preheat the bulbs before the element is near the heater, and then switch to an operating setting to achieve the desired temperature for melting the composition layer on element. The heater in the hot roll 32 is turned on to warm the outer surface 76 of the hot roll to the desired developing temperature. Servomotors in both the roller 28 and the hot roll 32 are turned on. The cylindrical photosensitive element 12 begins its rotation about the platform member 42 and the roller 28, and the continuous web 30 begins transport through the nip 74 rotating with the hot roll 32 at the same or substantially the same linear speed as the photosensitive element 12. The motor of the carriage assembly 40 is turned on to move the carriage 52 and position the exterior surface 19 of the element 12 into pressure contact with the development medium 30 residing on the hot roller 32. The composition layer of the photosensitive element is heated to between 40 and 230° C. (104-392° F.) while in contact with the development medium 30. The development medium 30 contacts the exterior surface 19 of the composition layer of the heated photosensitive element 12, and absorbs the liquefied portions of the elastomeric polymer from the unirradiated (uncured) portions of the composition layer, forming a relief printing form in which portions are removed to form a relief pattern or surface. By maintaining more or less intimate contact of the development medium 30 with the composition layer that is molten in the uncured regions, a transfer of the uncured photosensitive material from the photopolymerizable layer to the development medium 30 takes place. Intimate contact of the development medium 30 to the photopolymerizable layer may be maintained by pressing the layer and the development medium together. The development medium 30 may be removed immediately after traversing the nip area 74. The cylindrical photosensitive element 12 continuously rotates about the platform member 42 and the roller 28 during thermal development to continuously cycle through heating the element, contacting the web 30 to the element, and removing the web from the element. The means for changing the temperature may send a temperature controlling medium, such as cooling water, through the platform member 42 and/or the roller 28 to maintain constant the temperature of the photosensitive element 12.

The cycle of the steps of heating the composition layer, contacting the molten (portions) layer with the development medium, and removing the development medium can be repeated as many times as necessary to adequately remove the uncured material from the composition layer and create sufficient relief depth. It is desirable to minimize the number of cycles for suitable system performance, and typically the photosensitive element is thermally treated for 5 to 15 cycles. In one preferred embodiment, after one or two cycles of heating and contacting to remove the molten composition from the photosensitive element, the gearwheel 83 can be rotated to move the support arm 82 and the displaceable radiant heater 80 closer to the exterior surface 19 of the element, to thereby maintain the distance between the heater 80 and the cylindrical element 12 at or substantially at the predetermined distance. This incremental movement of the displaceable heater 80 to maintain the distance between the photosensitive element 12 and the heater 80 at the predetermined distance, d, can be done after every cycle or after any two cycles of heating and contacting.

The Photosensitive Element

The process includes providing a cylindrical element. In one embodiment, the cylindrical element is a photosensitive element that comprises at least one composition layer capable of being partially liquefied upon thermal development. That is, during thermal development the uncured composition must soften or melt or flow at a reasonable processing or developing temperature but not be subject to cold flow, i.e., dimensional change, during normal storage.

Preferably, the photosensitive element is an elastomeric printing element suitable for use as a flexographic printing form. The composition layer is preferably a photosensitive layer, and most preferably a photopolymerizable layer of an elastomeric composition wherein the photosensitive layer can be selectively cured by actinic radiation. As used herein, the term "photopolymerizable" is intended to encompass systems that are photopolymerizable, photocrosslinkable, or both. Throughout this specification actinic radiation will include ultraviolet radiation and/or visible light.

A preferred example of an elastomeric composition comprises at least one thermoplastic elastomeric block copolymer, at least one monomer, and at least one photoinitiator or a photoinitiator system. Preferably, the thermoplastic elastomeric block copolymer is an A-B-A type block copolymer, where A represents a non-elastomeric block, preferably a vinyl polymer and most preferably polystyrene, and B represents an elastomeric block, preferably polybutadiene or polyisoprene.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a description of some of these materials see U.S. Pat. No. 5,015,556.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide elastomeric property to the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators may be used. Alternatively, the photoinitiator may be a mixture of compounds, one of which provides the free radicals when caused to do so by a sensitizer activated by radiation.

The photopolymerizable layer can contain other additives depending on the final properties desired. Additional additives to the photopolymerizable layer include spectral sensitizing agents, sensitizers, plasticizers, rheology modifiers, thermal polymerization inhibitors, colorants, processing aids, antioxidants, antiozonants, UV absorbers and fillers.

Particularly preferred photosensitive elements that include a photopolymerizable layer having specific rheological properties are disclosed by Mengel et al. in PCT publication WO 01/88615 A1.

Flexographic printing plates formed from photopolymerizable compositions which are soluble, swellable, or dispersible in aqueous, semi-aqueous, or organic solvent developers (so called wet development) may also be suitable for use in the present invention to the extent that the photopolymerizable composition is also capable of liquefying upon thermal development to form a relief surface. Examples of suitable compositions for solvent development have been disclosed, for example, in Chen et al., U.S. Pat. No. 4,323,637, Gruetzmacher et al., U.S. Pat. No. 4,427,749 and Feinberg et al., U.S. Pat. No. 4,894,315.

The thickness of the photopolymerizable layer can vary over a wide range depending upon the type of printing form desired. In some embodiments, the photosensitive layer can have a thickness from about 0.002 inch to about 0.250 inch or greater (about 0.051 mm to about 0.64 cm or greater). Typical thickness of the photopolymerizable layer is from about 0.010 inches to about 0.250 inches (about 0.025 cm to about 0.64 cm).

The support can be any material that is conventionally used with photosensitive elements used to prepare flexographic printing plates. The support may be cylindrically shaped itself, or as was explained above, for plates-on-sleeves may be planar and mounted onto a cylindrical support, or may be planar sheet of a photosensitive plate formed into a cylinder by securing the end edges together by any method. Preferably the support is transparent to actinic radiation to accommodate "backflash" exposure through the support. Examples of suitable support materials include polymeric films such those formed by addition polymers and linear condensation polymers, transparent foams and fabrics. Under certain end-use conditions metals, such as aluminum, may also be used as a support, even though a metal support is not transparent to radiation. A preferred support is a polyester film; particularly preferred is polyethylene terephthalate. The support may be in sheet form or in cylindrical form, such as a sleeve. The type of sleeve or cylindrical support is not limited by the present invention. The sleeve may be formed from single layer or multiple layers of flexible material. The sleeve may also be made of non-transparent, actinic radiation blocking materials, such as nickel or glass epoxy. The support typically has a thickness from 0.002 to 0.050 inch (0.0051 to 0.127 cm). A preferred thickness for the sheet form is 0.003 to 0.016 inch (0.0076 to 0.040 cm). The sleeve can have a wall thickness from less than 10 mils (0.025 cm) to 80 mils (0.203 cm) or more, but typically has a wall thickness of 10 to 40 mils (0.025 to 0.10 cm). Generally, a preferred wall thickness is dependent upon the desired end-use conditions.

The preparation and formation of cylindrical seamless or substantially seamless photopolymerizable elements is not limited, and may be prepared for example, according to the methods and apparatuses disclosed by Cushner et al. in U.S. Pat. No. 5,798,019 and U.S. Pat. No. 5,916,403; Arimatsu in U.S. Pat. No. 4,337,220; Kitamura et al. in U.S. Pat. No. 4,868,090; Koch et al. in U.S. Pat. No. 4,869,997; Wallbillich et al. in U.S. Pat. No. 4,871,650 and U.S. Pat. No. 4,883,742; Fan et al. in U.S. Pat. No. 6,425,327; and Rossini et al. in U.S. Publication No. US 2002/0069777 A1. A seamless photopolymerizable layer means that the photopolymerizable layer is a continuum of photopolymeric material whereby no line of demarcation or joining of the photopolymeric material as a layer or other defect influencing print quality is present at least on exterior circumferential surface, i.e., printing surfaces, of the element. Preferably, the layer of photopolymeric material is continuous throughout the thickness of the layer, i.e., radially from the surface of the support to the exterior surface of the photopolymerizable layer, and along an axial length of the element. An example of a seamless photopolymerizable printing form is disclosed by Fan et al. in EP 0 766 142 A1. In addition, the photopolymerizable flat sheet elements can be reprocessed by cutting the element to wrap around the cylindrical support, (usually the printing sleeve), so that the edges contact without any gaps or overlapping, and fusing or joining the edges together to form a continuous cylindrical element. In yet another embodiment, the edges of the photopolymerizable flat sheet element can be butt joined by methods including, but not limited to, melt fusing, taping, stitching, clamping, stapling, taping, and gluing, to fuse or join the edges together to form a cylindrical element. Depending upon customer needs, after thermal development of the butt joined cylindrical form, the butt joined portion can be cut away and then mounted as a (planar) plate onto a printing cylinder. Alternatively, the photopolymerizable flat sheet element can be precision cut and registered when butt joining so that after thermal development the resulting cylindrical element can be mounted as is onto a printing cylinder (with or without a compressible print adapter sleeve between the printing cylinder and the cylindrical form). Processes for joining the edges of a plate in into a cylindrical form have been disclosed, for example, in German patent DE 28 44 426, United Kingdom Patent GB 1 579 817, and U.S. Pat. No. 4,758,500.

As is well known to those of ordinary skill in the art, additional layers may be present on top of the photopolymerizable layer, that is, on a side of the photopolymerizable layer opposite the support. These layers may include at least one thermally removable layer on the photopolymerizable layer, such as disclosed by Fan et al. in U.S. Pat. No. 6,773,859 B2. Depending on desired use, the additional layers may be opaque or transparent to actinic radiation, and may have one or more functions for the photosensitive element. The additional layers include, but is not limited to, a release layer, an actinic radiation opaque layer, a barrier layer, infrared-sensitive layer, an actinic-radiation opaque layer, an adhesion modifying layer, a layer which alters the surface characteristics of the photosensitive element, and combinations thereof. It is well within the ordinary skill of those in the art to select and prepare additional layers on the photopolymerizable layer according to desired end-use.

The photosensitive element optionally includes a temporary cover sheet on top of the outermost layer of the photosensitive element. Cover sheets consist of flexible polymeric films, and typically are polyesters, preferably polyethylene terephthalate. The cover sheet may be unsubbed, or may be subcoated with a thin silicone layer.

Before thermal treatment, the photosensitive element is exposed to actinic radiation. Upon imagewise exposure, the radiation-exposed areas of the photopolymerizable layer are converted to the insoluble state with no significant polymerization or crosslinking taking place in the unexposed areas of the layer. Any conventional source of actinic radiation can be used for this exposure. Examples of suitable radiation sources include xenon lamps, mercury vapor lamps, carbon arcs, argon glow lamps, fluorescent lamps with fluorescent materials emitting UV radiation and electron flash units, and photographic flood lamps. Typically, a mercury vapor arc or a sunlamp can be used at a distance of about 1.5 to about 60 inches (about 3.8 to about 1 53 cm) from the photosensitive element.

These radiation sources generally emit long-wave UV radiation between 31 0-400 nm. The exposure time may vary from a few seconds to minutes, depending upon the intensity and spectral energy distribution of the radiation, its distance from the photosensitive element, and the nature and amount of the photopolymerizable material.

Imagewise exposure can be carried out by exposing the photosensitive element through an image-bearing photomask. The photomask can be a separate film, i.e., an image-bearing transparency or phototool, such as a silver halide film; or the photomask can be integrated with the photosensitive element as described above. In the case in which the photomask is a separate film, the optional cover sheet is usually stripped before imagewise exposure leaving the release layer on the photosensitive element. The photomask is brought into close contact with the release layer of the photosensitive element by the usual vacuum processes, e.g., by use of a common vacuum frame. Thus a substantially uniform and complete contact between the photosensitive element and the photomask can be achieved in acceptable time.

It is preferred to form the integrated photomask on the cylindrical photosensitive element. In a particularly preferred embodiment, the photosensitive element includes the IR-sensitive layer which becomes the integrated photomask. The IR-sensitive layer is imagewise exposed to IR laser radiation to form the photomask on the photosensitive element. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. In so-called digital imaging, the radiation opaque layer is exposed imagewise to infrared laser radiation to form the image on or disposed above the photopolymerizable layer, i.e., the in-situ mask. The infrared laser radiation can selectively remove, e.g., ablate or vaporize, the infrared sensitive layer (i.e., radiation opaque layer) from the photopolymerizable layer, as disclosed by Fan in U.S. Pat. Nos. 5,262,275 and 5,719,009; and Fan in EP 0 741 330 B1. The integrated photomask remains on the photosensitive element for subsequent steps of UV pre-exposure, imagewise main exposure to actinic radiation and development.

In an alternate embodiment of digital method of mask formation, the photosensitive element will not initially include an infrared sensitive layer. In this case the infrared sensitive layer is the same as or substantially the same as the infrared sensitive layer included with the photosensitive layer as described above. A separate element bearing the infrared sensitive layer will form an assemblage with the photosensitive element such that the infrared sensitive layer is adjacent the surface of the photosensitive element opposite the support, which is typically the photopolymerizable layer. The separate element may include one or more other layers, such as ejection layers or heating layers, to aid in the digital exposure process. The assemblage is exposed imagewise with infrared laser radiation to selectively transfer the infrared sensitive layer and form the image on or disposed above the photopolymerizable layer as disclosed by Fan et al. in U.S. Pat. No. 5,607,814; and Blanchett in U.S. Pat. Nos. 5,766, 819; 5,840,463; and EP 0 891 877 A. Only the portions of the infrared sensitive layer which were transferred will reside on the photosensitive element forming the in situ mask.

Further, the mask image may be created on a separate carrier and then transferred by application of heat and/or pressure to the surface of the photopolymerizable layer opposite the support. The photopolymerizable layer is typically tacky and will retain the transferred image. The separate carrier can then be removed from the element prior to the pre-exposure and/or the imagewise exposure. The separate carrier may have an infrared sensitive layer that is imagewise exposed to laser radiation to selectively remove the material and form the image. An example of this type of carrier is LaserMask® imaging film by Rexam, Inc.

It is also contemplated that digital mask formation can be accomplished by imagewise application of the radiation opaque material in the form of Inkjet inks. Imagewise application of an ink-jet ink can be directly on the photopolymerizable layer or disposed above the photopolymerizable layer of the photosensitive element.

An overall back exposure through the support may be conducted before, after or during, preferably after, the imagewise exposure to polymerize a predetermined thickness of the photopolymer layer adjacent the support. This polymerized portion of the photopolymer layer is designated a floor. The floor provides improved adhesion between the photopolymerizable layer and the support, helps highlight dot resolution and also establishes the depth of the plate relief. The floor thickness varies with the time of exposure, exposure source, etc. This exposure may be with diffuse or directed radiation. All radiation sources suitable for imagewise main exposure may be used. The exposure is generally for 1-30 minutes.

Following imagewise exposure to actinic radiation through the mask and removal of the photomask if it is a separate film, the photosensitive printing element is thermally treated to remove unpolymerized areas in the photopolymerizable layer and thereby form a relief image. The thermal treating step removes at least the photopolymerizable layer in the areas that were not exposed to actinic radiation, i.e., the unexposed areas or uncured areas, of the photopolymerizable layer. For photosensitive elements including a separate IR-sensitive layer for digital formation of the mask, the treating step that forms the relief image in the photopolymerizable layer may also remove the mask image (which had been exposed to actinic radiation).

Treating the element thermally includes heating the photosensitive element having at least one composition layer, that is at least one photopolymerizable layer, (and the additional layer/s) to a temperature sufficient to cause the uncured portions of the photopolymerizable layer to soften or melt or flow. The exterior surface of the composition layer of the photosensitive element is heated to a temperature sufficient to cause a portion of the layer to liquefy. The thermal development process is conducted typically with more than one cycle of heating the element and contacting the element with the development medium in order to remove the uncured polymer to a suitable relief depth because uncured portions of the composition layer may only partially liquefy upon heating. In a preferred embodiment, treating also includes contacting an outermost surface of the element to an absorbent surface to absorb or wick away the melt or flow portions. The polymerized areas of the photopolymerizable layer have a higher melting temperature than the unpolymerized areas and therefore do not melt, soften, or flow at the thermal development temperatures. Thermal development of photosensitive elements to form flexographic printing plates is described by Martens in U.S. Pat. Nos. 5,015,556; 5,175,072; 5,215,859; and by Wang et al. in WO 98/13730.

The term "melt" is used to describe the behavior of the unirradiated portions of the photopolymerizable elastomeric layer subjected to an elevated temperature that softens and reduces the viscosity to permit flow and absorption by the development medium. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the absorbent material. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with an absorbent material can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while the uncured portions are melt) may be maintained by pressing the layer and the development medium together.

The development medium may also be referred to as absorbent material, web, and continuous web. The development medium is selected having a melt temperature exceeding the melt temperature of the uncured portions of the photopolymerizable layer and having good tear resistance at the same operating temperatures. Preferably, the selected material withstands the temperatures required to process the photosensitive element during heating. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by milligrams of elastomeric composition that can be absorbed per square centimeter of the development medium. Preferred is a non-woven web.

After the development step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art.

For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the postexposure and the finishing exposure are done at the same time on the photosensitive element using an exposure device that has both sources of radiation.

What is claimed is:

1. An apparatus for forming a printing form from a photosensitive element having an exterior surface and a composition layer capable of being partially liquefied, comprising:
    a displaceable heater for heating the composition layer at a predetermined distance from the exterior surface;
    means for removing at least a portion of the composition layer from the element;
    means for displacing the displaceable heater to the predetermined distance from the exterior surface; and
    means for controlling the means for displacing to move the displaceable heater a distance that is based on the predetermined distance and the photosensitive element.

2. The apparatus of claim 1 wherein the means for displacing maintains the predetermined distance constant.

3. The apparatus of claim 1 wherein the means for controlling comprises a table having data comprising the predetermined distance based on the photosensitive element.

4. The apparatus of claim 3, wherein the data in the table further comprises an incremental distance to move the displaceable heater to maintain the predetermined distance constant after removing at least a portion of the composition layer.

5. The apparatus of claim 1 wherein the means for displacing the displaceable heater comprises an actuating device connected to a movable arm, the displaceable heater mounted to an end of the arm.

6. The apparatus of claim 1 further comprising means for tilting the displaceable heater so that a face side of the displaceable heater is parallel to the exterior surface of the photosensitive element facing the displaceable heater.

7. The apparatus of claim 1, wherein the displaceable heater is selected from the group consisting of infrared radiant heaters, and carbon heaters, and wherein the displaceable heater is mounted in a housing that reflects heat generated by the displaceable heater.

8. The apparatus of claim 1 wherein the means for removing comprises means for supplying a development medium to contact the exterior surface of the photosensitive element and remove at least the portion of the composition layer.

9. An apparatus for forming a printing form from a photosensitive element having an exterior surface and a composition layer capable of being partially liquefied, comprising:
    a displaceable heater for heating the composition layer at a predetermined distance from the exterior surface;
    means for removing at least a portion of the composition layer from the element;
    means for displacing the displaceable heater to the predetermined distance from the exterior surface; and
    means for measuring a distance from the exterior surface to the displaceable heater.

10. The apparatus of claim 9, further comprising means for controlling the means for displacing based on input from the means from measuring.

11. A process for forming a printing form from a photosensitive element having an exterior surface and a composition layer capable of being partially liquefied, comprising:
    heating the composition layer with a displaceable heater at a predetermined distance from the exterior surface;
    removing at least a portion of the composition layer from the element;
    displacing the displaceable heater to the predetermined distance from the exterior surface; and
    controlling the displacing of the displaceable heater based on the predetermined distance and the photosensitive element.

12. The process of claim 11 wherein the displacing step moves the displaceable heater according to a table of data comprising the predetermined distance based on the photosensitive element.

13. The process of claim 11 further comprising maintaining the predetermined distance constant.

14. The process of claim 13 wherein the maintaining the predetermined distance constant comprises moving the displaceable heater an incremental distance to the predetermined distance by measuring a distance between the exterior surface and the displaceable heater, by using a table having data comprising the predetermined distance based on the photosensitive element, or by combinations thereof.

15. The process of claim 11 further comprising tilting the displaceable heater so that a face side of the displaceable heater is parallel to the exterior surface of the photosensitive element facing the displaceable heater.

16. The process of claim 11 wherein the photosensitive element is cylindrically-shaped, and the process further comprises supporting the cylindrically-shaped photosensitive element by contacting at least one part of an interior surface of the element.

17. The process of claim 11 further comprising repeating a cycle of the steps of heating and removing, and maintaining the predetermined distance constant by incrementally moving the displaceable heater.

18. The process of claim 17, wherein the incrementally moving of the displaceable heater is after at least two cycles of repeating the heating and the removing steps.

19. The process of claim 11 wherein the removing step comprises supplying a development medium to contact the exterior surface and remove the portion of the composition, and separating the development medium from the element.

20. A process for forming a printing form from a photosensitive element having an exterior surface and a composition layer capable of being partially liquefied, comprising:
    heating the composition layer with a displaceable heater at a predetermined distance from the exterior surface;
    removing at least a portion of the composition layer from the element;
    displacing the displaceable heater to the predetermined distance from the exterior surface; and,
    measuring a distance between the exterior surface and the displaceable heater, wherein the displacing step moves the displaceable heater to the predetermined distance.

* * * * *